US011302720B2

(12) United States Patent
Hu

(10) Patent No.: US 11,302,720 B2
(45) Date of Patent: Apr. 12, 2022

(54) ARRAY SUBSTRATE AND METHOD FOR FABRICATING SAME

(71) Applicant: WUHAN CHINA STAR OPTOELECTRONICS SEMICONDUCTOR DISPLAY TECHNOLOGY CO., LTD., Hubei (CN)

(72) Inventor: Niu Hu, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 236 days.

(21) Appl. No.: 16/758,708

(22) PCT Filed: Mar. 16, 2020

(86) PCT No.: PCT/CN2020/079451
§ 371 (c)(1),
(2) Date: Apr. 23, 2020

(87) PCT Pub. No.: WO2021/159576
PCT Pub. Date: Aug. 19, 2021

(65) Prior Publication Data
US 2021/0408054 A1 Dec. 30, 2021

(30) Foreign Application Priority Data

Feb. 12, 2020 (CN) .......................... 202010088951.4

(51) Int. Cl.
*H01L 27/12* (2006.01)
*G09F 9/30* (2006.01)

(52) U.S. Cl.
CPC ............ *H01L 27/124* (2013.01); *G09F 9/301* (2013.01); *H01L 27/1259* (2013.01)

(58) Field of Classification Search
CPC ............... H01L 27/124; H01L 27/1259; H01L 27/1244; H01L 27/12; G09F 9/301
See application file for complete search history.

(56) References Cited

U.S. PATENT DOCUMENTS

2019/0157311 A1* 5/2019 Zhang ................. H01L 51/0097
2020/0091268 A1* 3/2020 Cho ....................... H01L 27/124
2020/0175917 A1* 6/2020 Jo .......................... H01L 27/124
(Continued)

*Primary Examiner* — Kevin Quarterman

(57) ABSTRACT

The present disclosure provides an array substrate including a flexible substrate. The flexible substrate includes a display area and a bending area on a side of the display area. The bending area is provided with first traces, an insulating layer, buffer strips, a sealing layer, and second traces. The first traces are disposed on the flexible substrate at intervals. The insulating layer covers the flexible substrate and the first traces and is provided with a groove on each of the first traces. The buffer strips are respectively filled in the grooves. The sealing layer covers the insulating layer and the buffer strips to seal the buffer strips in the grooves. The second traces are disposed on the sealing layer at intervals. Projections of the second traces coincide with projections of the first traces on the flexible substrate. The present disclosure further provides a method for fabricating the array substrate.

10 Claims, 4 Drawing Sheets

(56) References Cited

U.S. PATENT DOCUMENTS

| | | | |
|---|---|---|---|
| 2020/0185428 A1* | 6/2020 | Um | H01L 51/0097 |
| 2020/0203653 A1* | 6/2020 | Um | H01L 27/3258 |
| 2020/0243778 A1* | 7/2020 | Li | H01L 27/3258 |
| 2020/0341516 A1* | 10/2020 | Huang | G06F 1/181 |
| 2021/0111191 A1* | 4/2021 | Zeng | H01L 27/1262 |

* cited by examiner

ARRAY SUBSTRATE AND METHOD FOR FABRICATING SAME

FIELD OF INVENTION

The present disclosure relates to a technical field of display, and particularly to an array substrate and a method for fabricating the same.

BACKGROUND

Currently, in a flexible display panel, a width of a lower frame is reduced by bending a bonding area. Furthermore, by improving a design of traces in a bending area, an area of the bending area is reduced to further narrow the lower frame.

The smaller the area of the bending area, the smaller a radius of the bending area when the bending area is bent. As a result, the traces in the bending area are subject to greater stress and are prone to breakage, leading to abnormal display.

SUMMARY OF DISCLOSURE

In order to solve the technical problem that the traces in the bending area are broken due to excessive stress when the bending area is bent, the present disclosure provides an array substrate. The array substrate comprises a flexible substrate. The flexible substrate comprises a display area and a bending area disposed on a side of the display area. The display area is provided with a plurality of data lines. The bending area is provided with a plurality of first traces, an insulating layer, a plurality of buffer strips, a sealing layer, and a plurality of second traces. The first traces are disposed on the flexible substrate at intervals. The insulating layer covers the flexible substrate and the first traces. The insulating layer is provided with a groove on each of the first traces. The buffer strips are respectively disposed in the grooves. The sealing layer covers the insulating layer and the buffer strips to seal the buffer strips in the grooves. The second traces are disposed on the sealing layer at intervals. Projections of the second traces on the flexible substrate respectively coincide with projections of the first traces on the flexible substrate. Each of the data lines is electrically connected to one of the first traces or the second traces.

In an embodiment, the bending area further comprises a buffer layer and a protective layer. The buffer layer covers the second traces and the sealing layer. The protective layer covers the buffer layer.

In an embodiment, the buffer strips are composed of a liquid crystal material.

The present disclosure further provides a method for fabricating an array substrate. The method comprises: providing a flexible substrate comprising a display area and a bending area located on a side of the display area; disposing a plurality of data lines on the flexible substrate in the display area at intervals; disposing a plurality of first traces on the flexible substrate in the bending area at intervals; forming an insulating layer covering the flexible substrate and the first traces in the bending area and provided with a groove on each of the first traces; filling the grooves with a buffer material to form a plurality of buffer strips; forming a sealing layer covering the insulating layer and the buffer strips to seal the huller strips in the grooves; and disposing a plurality of second traces on the sealing layer at intervals. Projections of the second traces on the flexible substrate respectively coincide with projections of the first traces on the flexible substrate. Each of the data lines is electrically connected to one of the first traces or the second traces.

In an embodiment, the method further comprises: forming a buffer layer covering the second traces and the sealing layer; and forming a protective layer covering the buffer layer.

In an embodiment, the buffer material is a liquid crystal material.

In an embodiment, a projection of each of the buffer strips on the flexible substrate falls within the projection of the adjacent first trace on the flexible substrate.

In an embodiment, each of the buffer strips is parallel to the adjacent first and second traces.

In the array substrate and the method for fabricating the same provided by the present disclosure, by disposing the buffer strips between each pair of the first and second traces opposite to each other in the bending area, stresses suffered by the first and second traces when the bending area is bent are relieved. This reduces a risk of breakages in the first and second traces.

BRIEF DESCRIPTION OF DRAWINGS

In order to more clearly illustrate the technical solutions in the embodiments of the present disclosure, a brief description of accompanying drawings used in the description of the embodiments of the present disclosure will be given below. Obviously, the accompanying drawings in the following description are merely some embodiments of the present disclosure. For those skilled in the art, other drawings may be obtained from these accompanying drawings without creative labor.

DETAILED DESCRIPTION

Figure 1:
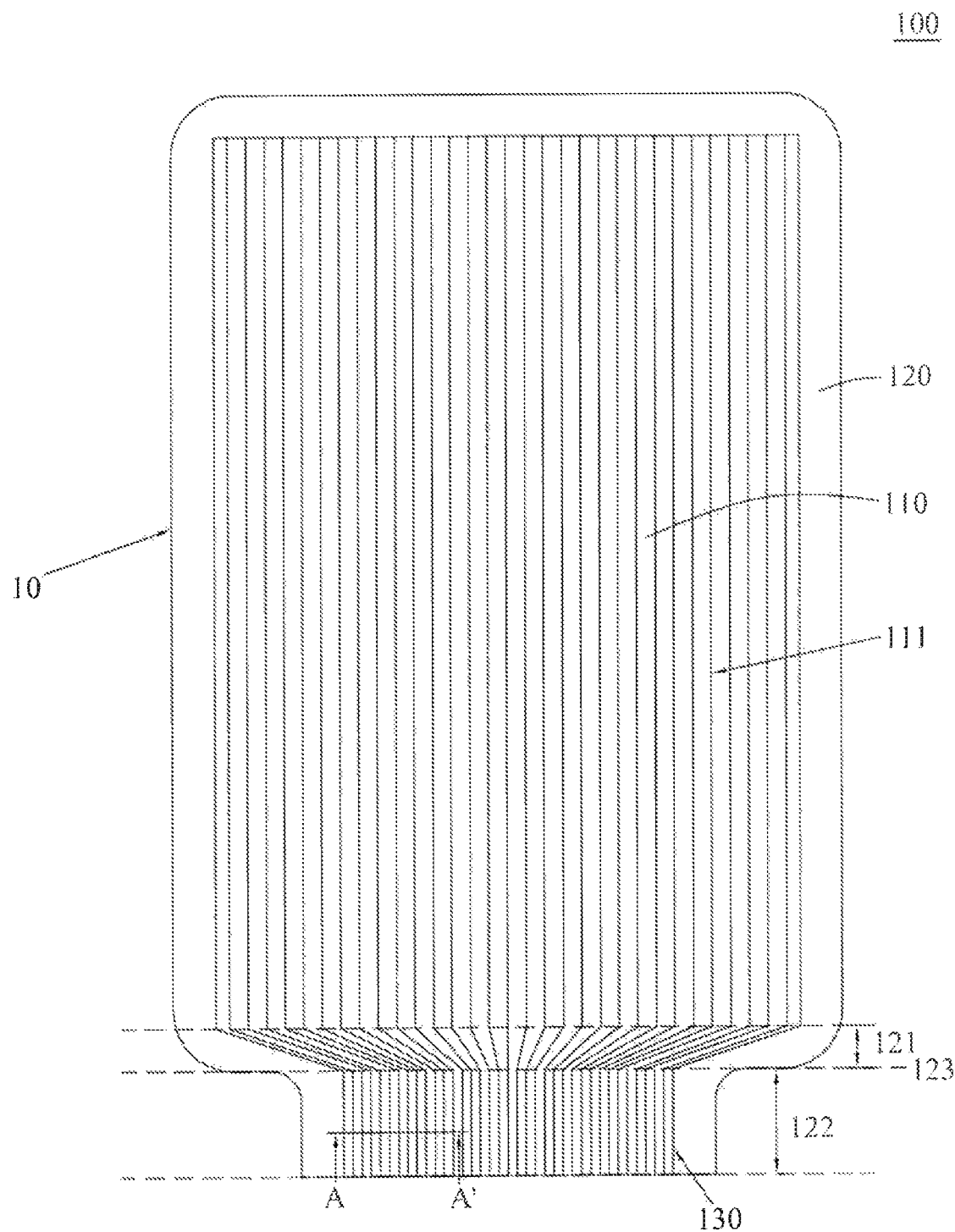
FIG. 1 is a schematic diagram of an array substrate according to an embodiment of the present invention.

The following description of various embodiments of the present disclosure with reference to the accompanying drawings is used to illustrate specific embodiments that can be practiced. Directional terms mentioned in the present disclosure, such as "above", "below", "left", "right", "inside", "outside", "side", are merely used to indicate the direction of the accompanying drawings. Therefore, the directional terms are used for illustrating and understanding the present disclosure rather than limiting the present disclosure. In the figures, elements with similar structures are indicated by the same reference numerals.

Please refer to FIG. 1, the present disclosure provides an array substrate 100. The array substrate 100 comprises a flexible substrate 10. The flexible substrate 10 may be made of polyimide (PI), polycarbonate (PC), polyether sulfone (FES), polyethylene terephthalate (PET), polyethylene naphthalate (PEN), fiber-reinforced polymer (FIT), and other flexible insulating polymer materials. The flexible substrate 10 may be transparent, translucent, or opaque. The flexible substrate 10 comprises a display area 110 and a non-display area 120 surrounding the display area 110. The non-display area 120 comprises a fan-out area 121 and a bending area 122 on a side of the display area 110. The fan-out area 121 is located between the display area 110 and the bending area 122, There is a bending line 123 between the fan-out area 121 and the bending area 122. The bending area 122 can be bent downward along the bending line 123 toward the display area 110.

The display area 110 is provided with a plurality of data lines 111. Specifically, the display area 110 is provided with a driving circuit layer comprising a plurality of thin-film transistors, a plurality of scan lines, and a plurality of data lines 111. The scan lines and the data lines 111 are electrically connected to the thin-film transistors. The data lines 111 are configured for transmitting data signals. The fan-out area 121 and the bending area 122 are provided with a plurality of metal traces 130 across them. The metal traces 130 are electrically connected to the data lines 111, respectively, and are configured for transmitting data signals, Each of the metal traces 130 and its corresponding data line 111 may be integrally formed, FIG. 1 shows that the metal traces 130 in the fan-out area 121 fan out, and the metal traces 130 in the bending area 122 are straight lines parallel to each other, but they are not limited thereto. In an embodiment, the metal traces 130 in the bending area 122 may fan out. In an embodiment, distribution of the metal traces 130 in the bending area 122 may be a combination of one or more fan-out distributions and one or more straight-line distributions.

Figure 2:
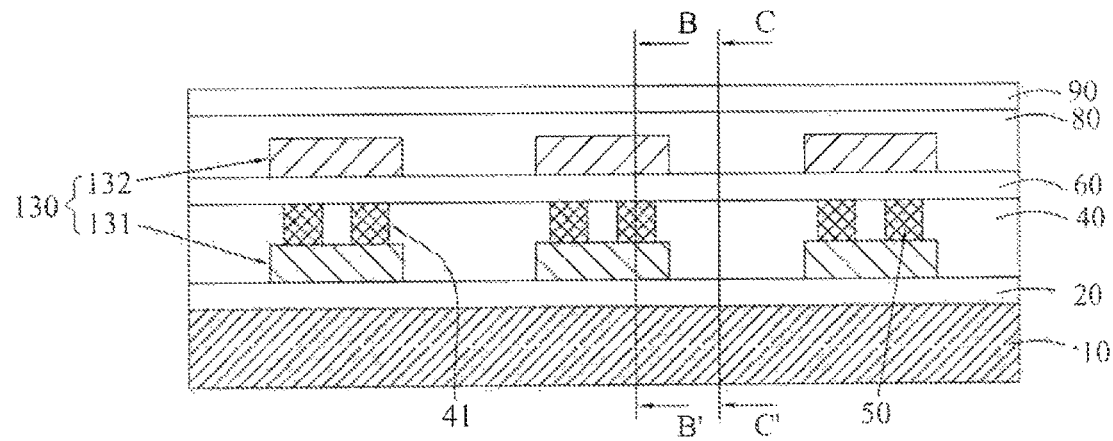
FIG. 2 is a schematic cross-sectional view of the array substrate of FIG. 1 along line A-A'.

Please refer to FIG. 2, the metal traces 130 in the bending area 122 comprise a plurality of first traces 131 and a plurality of second traces 132. A structure of the bending area 122 comprises the flexible substrate 10, a first buffer layer 20, the first traces 131, an insulating layer 40, a plurality of buffer strips 50, a sealing layer 60, the second traces 132, a second buffer layer 80, and a protective layer 90.

The first buffer layer 20 covers the bending area 122 of the flexible substrate 10. The first buffer layer 20 may be made of a soft organic material for releasing stress suffered by the bending area 122, such as alucone. The first buffer layer 20 may also be an organic-inorganic hybrid film comprising aluminum, titanium, zinc, or iron. The first traces 131 are disposed on the first buffer layer 20 at intervals. The insulating layer 40 covers the first buffer layer 20 and the first traces 131. The insulating layer 40 may be made of silicon nitride, silicon oxide, or a combination thereof, but is not limited thereto.

In an embodiment, the first buffer layer 20 may not be provided. The first traces 131 are directly disposed on the bending area 122 of the flexible substrate 10 at intervals, and the insulation layer 40 covers the flexible substrate 10 and the first traces 131, FIG. 2 shows that the insulating layer 40 is provided with two grooves 41 on each of the first traces 131, but is not limited thereto. The insulating layer 40 may be provided with one or more grooves 41 on each of the first traces 131. The buffer strips 50 are respectively disposed in the grooves 41, A projection of each of the buffer strips 50 on the flexible substrate 10 falls within the projection of the adjacent first trace 131 on the flexible substrate 10. The buffer strips 50 are composed of a buffer material and configured to release stress generated by the bending area 122 when the bending area is bent. The buffer material may be a flowing material, such as a liquid crystal material, which can flow freely in the grooves 41, Preferably, the buffer strips 50 are composed of a liquid crystal material. The liquid crystal material may be nematic liquid crystals, smectic liquid crystals, cholesteric liquid crystals, or a combination thereof.

The sealing layer 60 covers the insulating layer 40 and the buffer strips 50 to seal the buffer strips 50 in the grooves 41. The sealing layer 60 may be made of silicon nitride, silicon oxide, or a combination thereof, but is not limited thereto. The sealing layer 60 may also be made of an organic material, such as alucone. The sealing layer 60 may also be an organic-inorganic hybrid film comprising aluminum, titanium, zinc, or iron.

The second traces 132 are disposed on the sealing layer 60 at intervals. Projections of the second traces 132 on the flexible substrate 10 respectively coincide with projections of the first traces 131 on the flexible substrate 10. Therefore, one or more buffer strips 50 are provided between each pair of the first traces 131 and second traces 132 opposite to each other.

The second buffer layer 80 covers the second traces 132 and the sealing layer 60. The second buffer layer 80 may be made of a soft organic material, such as alucone, for releasing stress suffered by the bending area 122. The second buffer layer 80 may also be an organic-inorganic hybrid film comprising aluminum, titanium, zinc, or iron. A material of the second buffer layer 80 may be the same as or different from that of the first buffer layer 20.

The protective layer 90 covers the second buffer layer 80 and is configured to prevent moisture and oxygen in the atmosphere from entering the structure of the bending area 122. This prevents moisture and oxygen from contacting and eroding the first traces 131 and the second traces 132 or prevents moisture from penetrating into the buffer strips 50 and affecting effect of the buffer strips 50 on releasing stress. The protective layer 90 may be composed of aluminum oxide, silicon oxide, magnesium oxide, or a combination thereof, but is not limited thereto.

Figure 3:
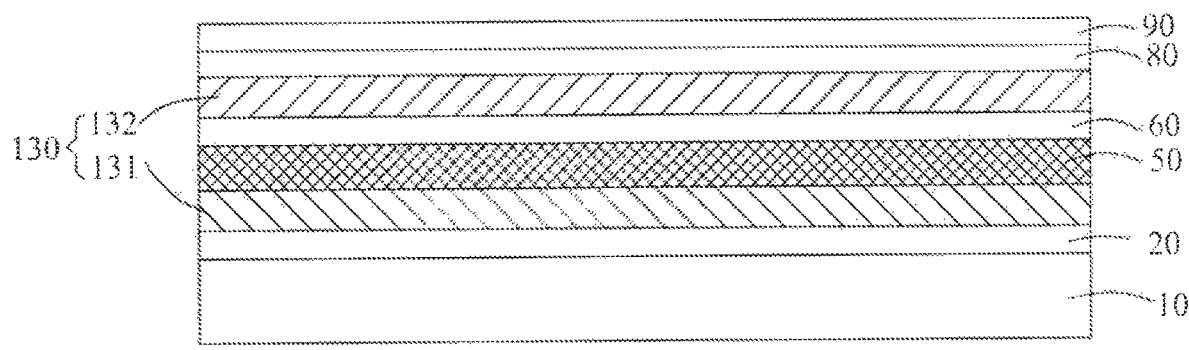
FIG. 3 is a schematic cross-sectional view of the array substrate of FIG. 2 along line B-B'.
Figure 4:
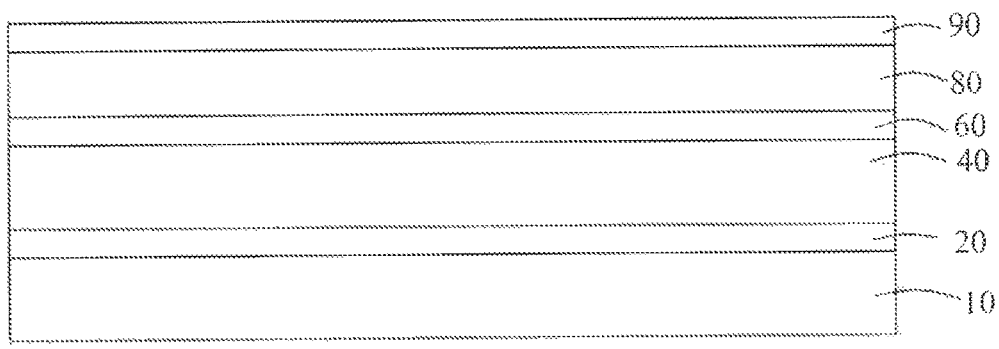
FIG. 4 is a schematic cross-sectional view of the array substrate of FIG. 2 along a line C-C'.

Please refer to FIG. 3, each of the buffer strips 50 is parallel to the adjacent first and second traces 131 and 132, respectively. Please refer to FIG. 4, the insulating layer 40 between the adjacent first traces 131 is neither provided with any grooves 41 nor any buffer strips 50.

Please refer to FIG. 1 and FIG. 2., each of the data lines 111 is electrically connected to one of the first traces 131 or the second traces 132. The fan-out area 121 may have a structure similar to the structure of the bending area 122, The fan-out area 121 may also have a structure in which the metal traces 130 are disposed on a same plane.

The present disclosure further provides a method for fabricating the aforementioned array substrate 100, which comprises the following steps.

First, please refer to FIG. 1, a flexible substrate 10 is provided. The flexible substrate 10 comprises a display area 110 and a non-display area 120 surrounding the display area 110. The non-display area 120 comprises a fan-out area 121 and a bending area 122 on a side of the display area 110. The fan-out area 121 is located between the display area 110 and the bending area 122. There is a bending line 123 between the fan-out area 121 and the bending area 122. The bending area 122 can be bent downward along the bending line 123 toward the display area 110. Then, a plurality of data lines 111 are disposed on the flexible substrate 10 in the display area 110 at intervals. Then, a plurality of metal traces 130 are disposed across the fan-out area 121 and the bending area 122 at intervals. The metal traces 130 are electrically connected to the data lines 111, respectively, FIG. 1 shows that the metal traces 130 in the fan-out area 121 fan out, and the metal traces 130 in the bending area 122 are straight lines parallel to each other, but they are not limited thereto. In an embodiment, the metal traces 130 in the bending area 122 may fan out. In an embodiment, distribution of the metal traces 130 in the bending area 122 may be a combination of one or more fan-out distributions and one or more straight-line distributions.

Please refer to FIG. 2, the metal traces 130 in the bending area 122 comprise a plurality of first traces 131 and a plurality of second traces 132. A structure of the bending area 122 comprises the flexible substrate 10, a first buffer layer 20, the first traces 131, an insulating layer 40, a plurality of buffer strips 50, a sealing layer 60, the second traces 132, a second buffer layer 80, and a protective layer 90. A method for fabricating the bending area 122 comprises the following steps.

Figure 5:
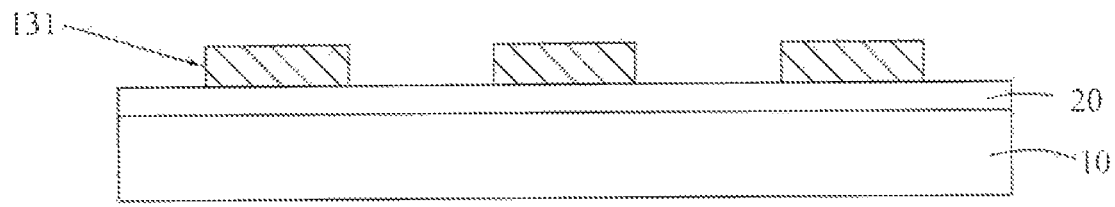
FIG. 5 to FIG. 8 are schematic flowcharts of a method for fabricating a bending area of FIG. 1.

Step 1: please refer to FIG. 5, forming the first buffer layer 20 covering the bending area 122 of the flexible substrate 10.

Step 2: please refer to FIG. 5, disposing the first traces 131 on the first buffer layer 20 at intervals.

Figure 6:
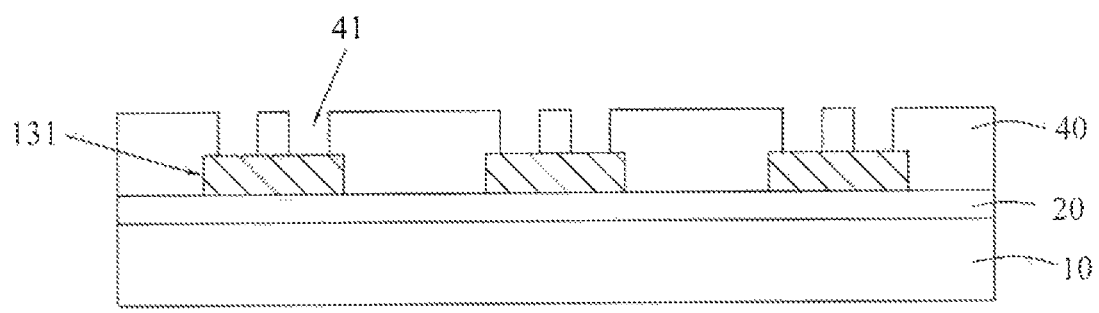

Step 3: please refer to FIG. 6, forming the insulating layer 40 covering the first buffer layer 20 and the first traces 131.

In an embodiment, the first buffer layer 20 may not be provided. The first traces 131 are directly disposed on the bending area 122 of the flexible substrate 10 at intervals, and the insulation layer 40 covers the flexible substrate 10 and the first traces 131.

Step 4: please refer to FIG. 6, etching the insulating layer 40 to form one or more grooves 40 on each of the first traces 131. A bottom of each groove 40 may be a corresponding first trace 131. FIG. 2 shows that the insulating layer 40 is provided with two grooves 41 on each of the first traces 131, but is not limited thereto. The insulating layer 40 may be provided with one or more grooves 41 on each of the first traces 131. The insulating layer 40 between the adjacent first traces 131 is not provided with any grooves 41.

Figure 7:
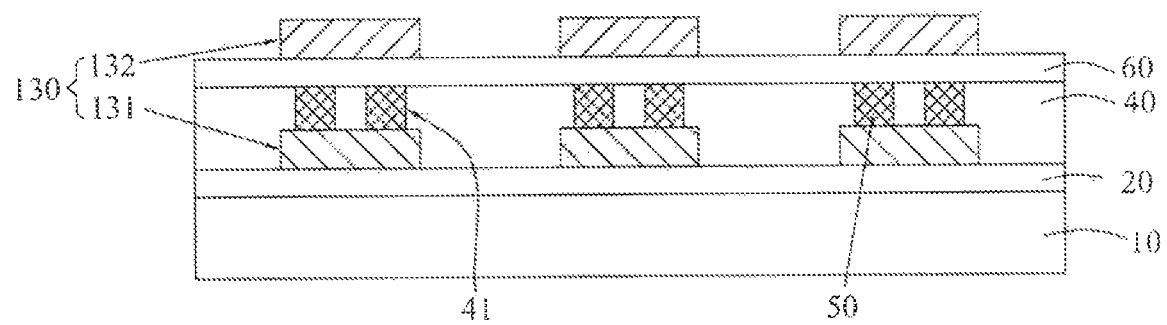

Step 5: please refer to FIG. 7, filling the grooves 41 with a buffer material to form the buffer strips 50. That is, one or more buffer strips 50 are formed on each of the first traces 131, and no buffer strips 50 are provided between the adjacent first traces 131. Each of the buffer strips 50 is parallel to the adjacent first traces 131. A projection of each of the buffer strips 50 on the flexible substrate 10 falls within a projection of the adjacent first trace 131 on the flexible substrate 10. The buffer strips 50 are configured to release stress generated by the bending area 122 when the bending area is bent. The buffer material may be a flowing material, such as a liquid crystal material, which can flow freely in the grooves.

Step 6: please refer to FIG. 7, forming the sealing layer 60 covering the insulating layer 40 and the buffer strips 50 to seal the buffer strips 50 in the grooves 41.

Step 7: please refer to FIG. 7, disposing the second traces 132 on the sealing layer 60 at intervals. Projections of the second traces 132 on the flexible substrate 10 respectively coincide with projections of the first traces 131 on the flexible substrate 10. Therefore, one or more buffer strips 50 are disposed between each pair of the first traces 131 and second traces 132 opposite to each other. Each of the buffer strips 50 is parallel to the adjacent first and second traces 131 and 132.

Figure 8:
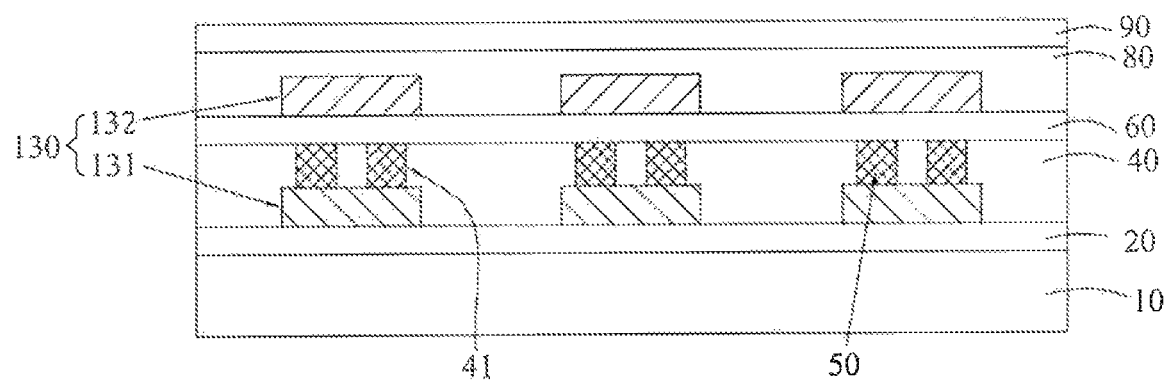

Step 8: please refer to FIG. 8, forming the second buffer layer 80 covering the second traces 132 and the sealing layer 60.

Step 9: please refer to FIG. 8, forming the protective layer 90 covering the second buffer layer 80. The protective layer 90 is configured to prevent moisture and oxygen in the atmosphere from entering the structure of the bending area 122. This prevents moisture and oxygen from contacting and eroding the first traces 131 and the second traces 132 or prevents moisture from penetrating into the buffer strips 50 and affecting effect of the buffer strips 50 on releasing stress.

Please refer to FIG. 1 and FIG. 8, each of the data lines 111 is electrically connected to one of the first traces 131 or the second traces 132. The fan-out area 121 may have a structure similar to the structure of the bending area 122. Therefore, a method for fabricating the fan-out area 121 may be the same as the method for fabricating the bending area 122.

Materials of the flexible substrate 10, the first buffer layer 20, the insulating layer 40, the buffer strips 50, the sealing layer 60, the second buffer layer 80, and the protective layer 90 are as described above, and will not be described in detail herein.

In the array substrate 100 and the method for fabricating the same provided by the present disclosure, by disposing the buffer strips 50 between each pair of the respective first and second traces 131 and 132 opposite to each other in the bending area 122, stresses suffered by the respective first and second traces 131 and 132 when the bending area 122 is bent are relieved. This reduces a risk of breaks in the first and second traces 131 and 132. In addition, the array substrate 100 and the method for fabricating the same provided by the present disclosure can be applied to any flexible display device and any method for fabricating the same.

The present application has been described in the above preferred embodiments, but the preferred embodiments are not intended to limit the scope of the present application, and those skilled in the art may make various modifications without departing from the scope of the present application. The scope of the present application is determined by claims,

What is claimed is:

1. An array substrate, comprising a flexible substrate, wherein the flexible substrate comprises:
   a display area provided with a plurality of data lines; and
   a bending area disposed on a side of the display area and provided with:
      a plurality of first traces disposed on the flexible substrate at intervals;
      an insulating layer covering the flexible substrate and the first traces and provided with a groove on each of the first traces;
      a plurality of buffer strips respectively disposed in the grooves;
      a sealing layer covering the insulating layer and the buffer strips to seal the buffer strips in the grooves; and
      a plurality of second traces disposed on the sealing layer at intervals, wherein projections of the second traces on the flexible substrate respectively coincide with projections of the first traces on the flexible substrate, and each of the data lines is electrically connected to one of the first traces or the second traces.

2. The array substrate according to claim 1, wherein a projection of each of the buffer strips on the flexible substrate falls within the projection of the adjacent first trace on the flexible substrate.

3. The array substrate according to claim 2, wherein each of the buffer strips is parallel to the adjacent first trace and the adjacent second trace.

4. The array substrate according to claim 3, wherein the buffer strips are composed of a liquid crystal material.

5. The array substrate according to claim 1, wherein the bending area further comprises:

a buffer layer covering the second traces and the sealing layer; and a protective layer covering the buffer layer.

6. A method for fabricating an array substrate, comprising:

provide a flexible substrate comprising a display area and a bending area located on a side of the display area;

disposing a plurality of data lines on the flexible substrate in the display area at intervals;

disposing a plurality of first traces on the flexible substrate in the bending area at intervals;

forming an insulating layer covering the flexible substrate and the first traces in the bending area and provided with a groove on each of the first traces;

filling the grooves with a buffer material to form a plurality of buffer strips;

forming a sealing layer covering the insulating layer and the buffer strips to seal the buffer strips in the grooves; and disposing a plurality of second traces on the sealing layer at intervals, wherein projections of the second traces on the flexible substrate respectively coincide with projections of the first traces on the flexible substrate, and each of the data lines is electrically connected to one of the first traces or the second traces.

7. The method for fabricating the array substrate according to claim 6, wherein a projection of each of the buffer strips on the flexible substrate falls within the projection of the adjacent first trace on the flexible substrate.

8. The method for fabricating the array substrate according to claim 7, wherein each of the buffer strips is parallel to the adjacent first trace and the adjacent second trace.

9. The method for fabricating the array substrate according to claim 6, wherein the buffer material is a liquid crystal material.

10. The method for fabricating the array substrate according to claim 6, further comprising:

forming a buffer layer covering the second traces and the sealing layer; and forming a protective layer covering the buffer layer.

* * * * *